United States Patent
Kim et al.

(10) Patent No.: US 7,034,220 B2
(45) Date of Patent: Apr. 25, 2006

(54) FILTER HOLDER AND DISPLAY APPARATUS INCLUDING THE SAME

(75) Inventors: Myoung-Kon Kim, Asan-si (KR); Ki-Jung Kim, Cheonan-si (KR); Won-Kyu Bang, Asan-si (KR)

(73) Assignee: Samsung SDI Co., Ltd., Suwon-si (KR)

( * ) Notice: Subject to any disclaimer, the term of this patent is extended or adjusted under 35 U.S.C. 154(b) by 46 days.

(21) Appl. No.: 10/919,460

(22) Filed: Aug. 17, 2004

(65) Prior Publication Data

US 2005/0062373 A1    Mar. 24, 2005

(30) Foreign Application Priority Data

Sep. 20, 2003  (KR) .................. 10-2003-0065409

(51) Int. Cl.
    *H05K 9/00*    (2006.01)
(52) U.S. Cl. ................ 174/35 MS; 174/35 R; 361/816
(58) Field of Classification Search ........... 174/35 MS, 174/35 R; 361/816, 818; 313/313, 479; 348/819
See application file for complete search history.

(56) References Cited

U.S. PATENT DOCUMENTS

| | | | |
|---|---|---|---|
| 6,081,425 A * | 6/2000 | Cheng ................ | 174/35 R |
| 6,348,653 B1 * | 2/2002 | Cho ................ | 174/35 MS |
| 6,403,879 B1 * | 6/2002 | Clements et al. ...... | 174/35 GC |
| 6,627,812 B1 * | 9/2003 | Kim et al. ........... | 174/35 R |
| 6,731,519 B1 * | 5/2004 | Hwang ................ | 174/35 R |
| 6,781,851 B1 * | 8/2004 | Daoud et al. ......... | 361/816 |
| 6,816,368 B1 * | 11/2004 | Yokosawa ............ | 174/35 R |
| 6,879,495 B1 * | 4/2005 | Jiang ................. | 174/35 R |
| 6,882,108 B1 * | 4/2005 | Kim et al. ............ | 361/816 |
| 6,947,294 B1 * | 9/2005 | Lin et al. ............ | 174/35 R |
| 6,963,489 B1 * | 11/2005 | Askeland et al. ...... | 361/816 |

FOREIGN PATENT DOCUMENTS

| | | |
|---|---|---|
| KR | 1999-0069145 | 9/1999 |
| KR | 2000-0011358 | 2/2000 |

* cited by examiner

*Primary Examiner*—Dean A. Reichard
*Assistant Examiner*—Adolfo Nino
(74) *Attorney, Agent, or Firm*—Robert E. Bushnell, Esq.

(57) ABSTRACT

A filter holder and a display apparatus including the filter holder prevent image quality from being degraded, and prevent a display panel from being damaged, by efficiently discharging heat generated by the display panel. The filter holder includes a pressing portion that presses an EMI filter toward and against a front portion of a front cabinet, a fixing portion that is fixed on the front portion of the front cabinet, and an inner wall portion that connects the pressing portion and the fixing portion. At least one first hole can be provided in the inner wall portion; at least one second hole can be provided in the fixing portion fixed on the front portion of the front cabinet; at least one third hole can be provided in an outer wall portion; at least one fourth hole can be provided in the front portion of the front cabinet; and at least one fifth hole can be provided in a lateral portion of the front cabinet.

20 Claims, 5 Drawing Sheets

FILTER HOLDER AND DISPLAY APPARATUS INCLUDING THE SAME

CLAIM OF PRIORITY

This application makes reference to, incorporates the same herein, and claims all benefits accruing under 35 U.S.C. § 119 from an application for FILTER HOLDER AND DISPLAY APPARATUS INCLUDING THE SAME earlier filed in the Korean Intellectual Property Office on 20 Sep. 2003 and there duly assigned Serial No. 2003-65409.

BACKGROUND OF THE INVENTION

1. Technical Field

The present invention relates to a filter holder and a display apparatus including the filter holder and, more particularly, to a filter holder allowing hot air to flow through it, and a display apparatus including the filter holder, the display apparatus including a plasma display panel generating a large amount of heat.

2. Description of the Related Art

Plasma display panels are devices for displaying images using a gas discharging phenomenon. In the plasma display panel, a discharging process occurs in a gas by means of electrodes, to which a direct current (DC) or an alternating current (AC) voltage is applied. Due to the discharging process, the gas radiates ultraviolet rays which excite phosphor so as to emit visible light.

A display apparatus comprises a front cabinet which includes a window at a center portion thereof, an EMI filter disposed to the rear of the front cabinet so as to cover the window, a filter holder that fixes the EMI filter onto a front portion of the front cabinet, a display panel disposed on a rear portion of the filter holder and including an upper panel and a lower panel, a chassis that supports the display panel, a circuit unit installed in the rear of the chassis and driving the display panel, and a rear cabinet disposed in the rear of the circuit unit and coupled to the front cabinet.

The EMI filter is pressed against a rear surface of the front portion of the front cabinet by the filter holder which is fixed to a screw coupling portion by screws. The display panel contacts a sponge which is attached to a rear surface of the filter holder. The circuit unit driving the display panel is connected to the display panel via flexible printed circuits (FPCs).

The display panel may be a liquid crystal display (LCD), a plasma display panel (PDP), or a field emission display (FED). The PDP generates much heat due to the discharging processes occurring between electrodes, and a large amount of the heat is absorbed by air induced through an air inlet and discharged through an air outlet.

When the display panel operates and generates heat, some of the heat is transmitted to the chassis disposed in the rear of the display panel, and the rest of the heat is transmitted to the air between the display panel and the EMI filter. The heated air between the display panel and the EMI filter moves toward a first space above the display panel through the sponge. However, since the air of high temperature in the first space cannot rise due to the filter holder, it moves to the rear along an inner wall of the filter holder. That is, the air of high temperature stays in the first space for a long time and, as a result, the heat generated by the display panel cannot be discharged efficiently. When the heat of the display panel is not discharged efficiently, the image quality of the display panel is degraded and the display panel may be damaged.

SUMMARY OF THE INVENTION

The present invention provides a filter holder, and a display apparatus including the filter holder, for efficiently discharging heat generated by a display panel so as to prevent the image quality from being degraded and to prevent the display panel from being damaged.

According to one aspect of the present invention, there is provided a filter holder which includes: a pressing portion which presses an EMI filter against a front portion of a front cabinet; a fixing portion that is fixed to the front portion of the front cabinet; and an inner wall portion that connects the pressing portion and the fixing portion. The inner wall portion includes at least one first hole.

According to another aspect of the present invention, there is also provided a display apparatus which includes: a front cabinet which includes a window at a center portion of the cabinet; an EMI filter disposed to the rear of the front cabinet so as to cover the window; a filter holder which includes a pressing portion that presses an EMI filter against a front portion of a front cabinet, a fixing portion fixed to the front portion of the front cabinet, and an inner wall portion connecting the pressing portion and the fixing portion; a display panel disposed in the rear of the pressing portion of the filter holder; a chassis that supports the display panel; a circuit unit installed in the rear of the chassis for driving the display panel; and a rear cabinet disposed in the rear of the circuit unit and coupled to the front cabinet. In addition, the inner wall portion of the filter holder includes at least one first hole.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
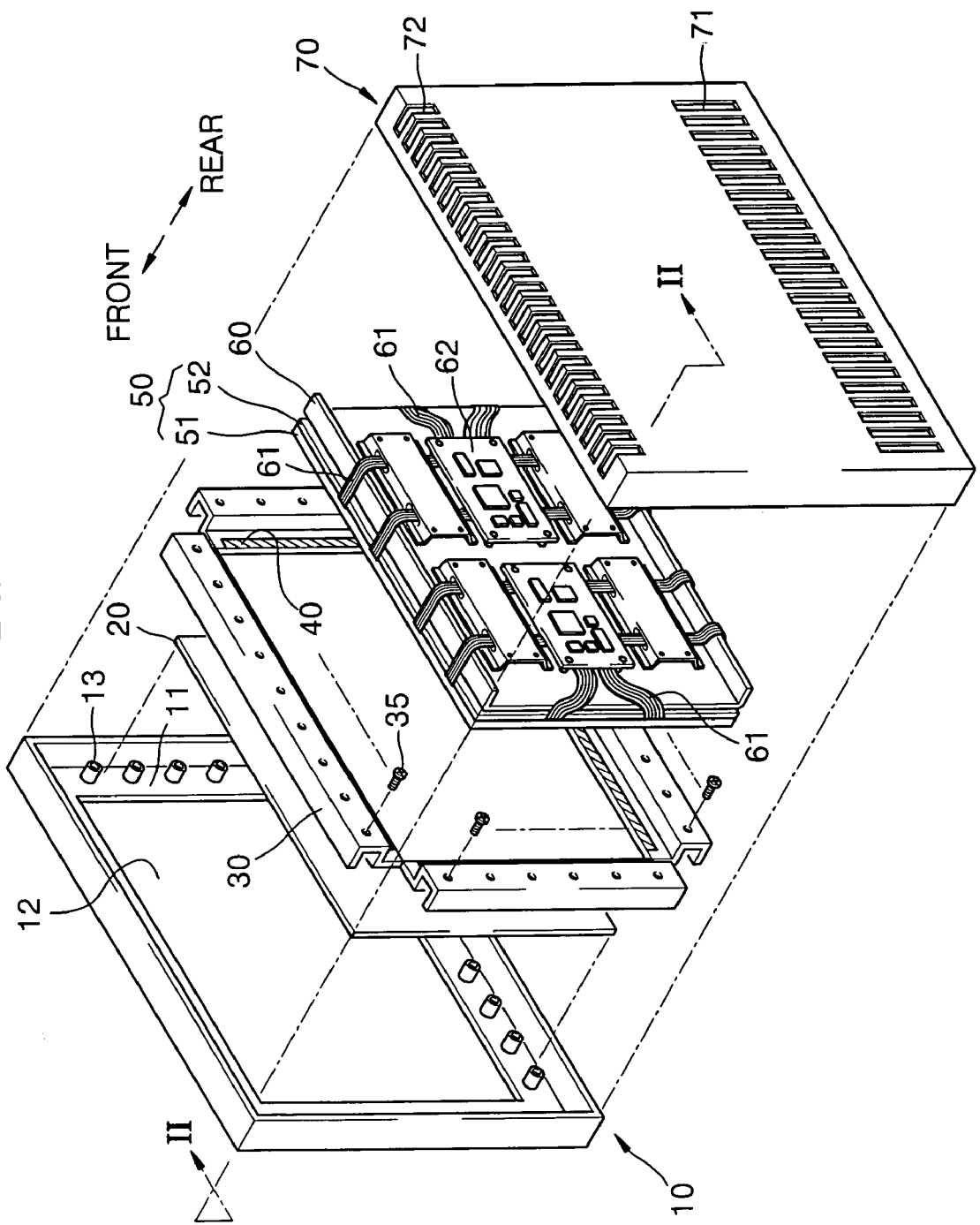
FIG. 1 is an exploded perspective view of a display apparatus.

Turning now to the drawings, FIG. 1 is an exploded perspective view of a display apparatus. The display apparatus comprises a front cabinet 10 including a window 12 at a center portion thereof, an EMI filter 20 disposed in the rear of the front cabinet 10 so as to cover the window 12, a filter holder 30 which fixes the EMI filter 20 onto a front portion 11 of the front cabinet 10, a display panel 50 disposed on a rear portion of the filter holder 30 and including an upper panel 51 and a lower panel 52, a chassis 60 which supports the display panel 50, a circuit unit 62 installed in the rear of the chassis 60 for driving the display panel 50, and a rear cabinet 70 disposed in the rear of the circuit unit 62 and coupled to the front cabinet 10.

The EMI filter 20 is pressed against a rear surface of the front portion 11 by the filter holder 30 which is fixed to a screw coupling portion 13 by screws 35. The display panel 50 contacts a sponge 40 which is attached to a rear surface of the filter holder 30. The circuit unit 62 which drives the display panel 50 is connected to the display panel 50 via flexible printed circuits (FPCs) 61.

The display panel may be a liquid crystal display (LCD), a plasma display panel (PDP), or a field emission display (FED). The PDP generates much heat due to the discharging processes occurring between electrodes, and a large amount of the heat is absorbed by air induced through an air inlet 71 and discharged through an air outlet 72.

Figure 2:
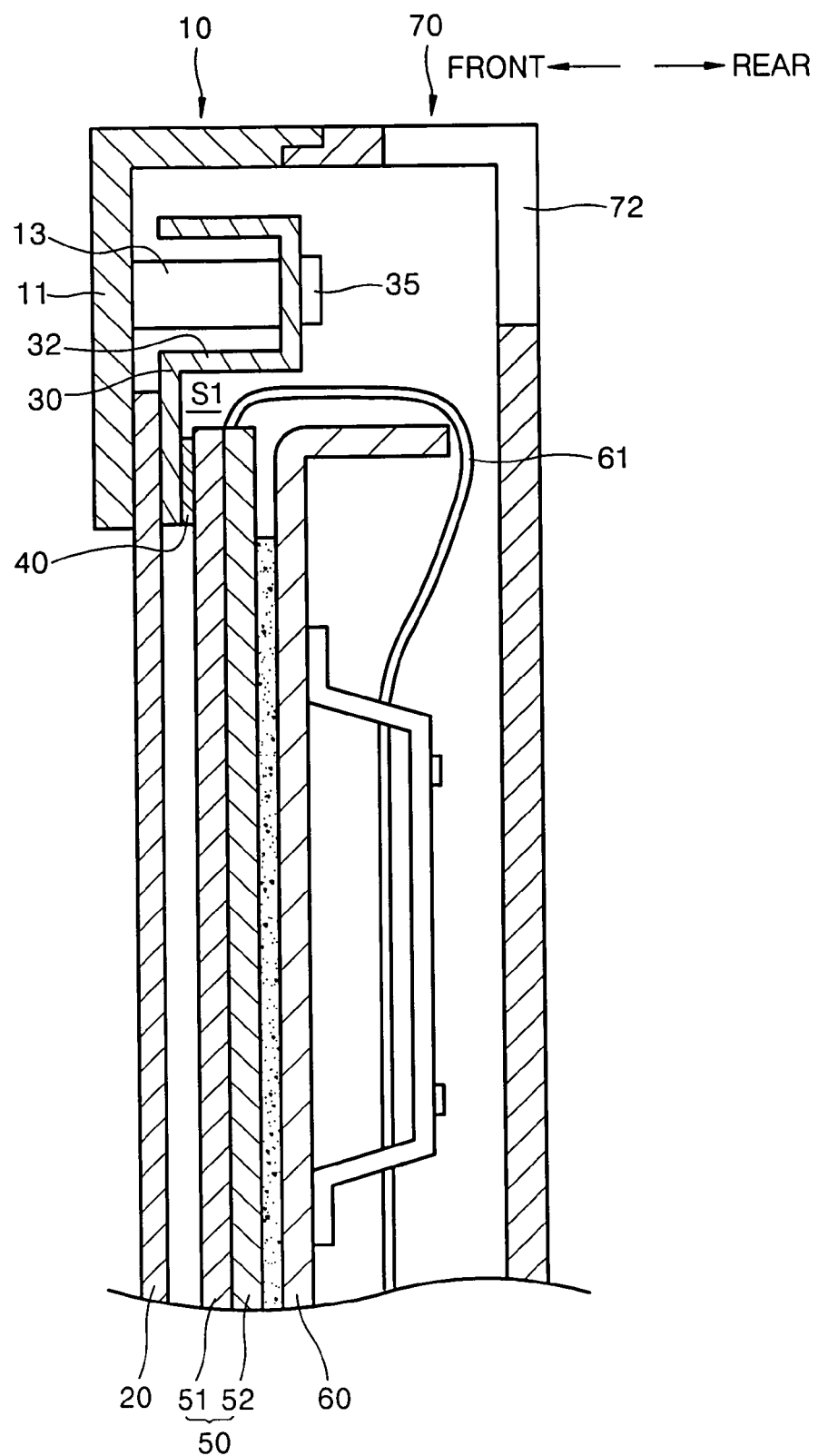
FIG. 2 is a cross-sectional view taken along line II—II of FIG. 1.

FIG. 2 is a cross-sectional view taken along line II—II of FIG. 1. FIG. 2 illustrates an assembled state of the display apparatus having the structure described above. When the display panel 50 operates and generates heat, some of the heat is transmitted to the chassis 60 which is disposed in the rear of the display panel 50, and the rest of the heat is transmitted to the air between the display panel 50 and the EMI filter 20. The heated air between the display panel 50 and the EMI filter 20 moves through the sponge 40 toward a first space S1 above the display panel 50. However, since the air of high temperature in the first space S1 cannot rise due to the filter holder 30, it moves to the rear along an inner wall 32 of the filter holder 30. That is, the air of high temperature stays in the first space S1 for a long time and, as a result, the heat generated by the display panel 50 cannot be discharged efficiently. When the heat of the display panel is not discharged efficiently, the image quality of the display panel is degraded and the display panel may be damaged.

Figure 3:
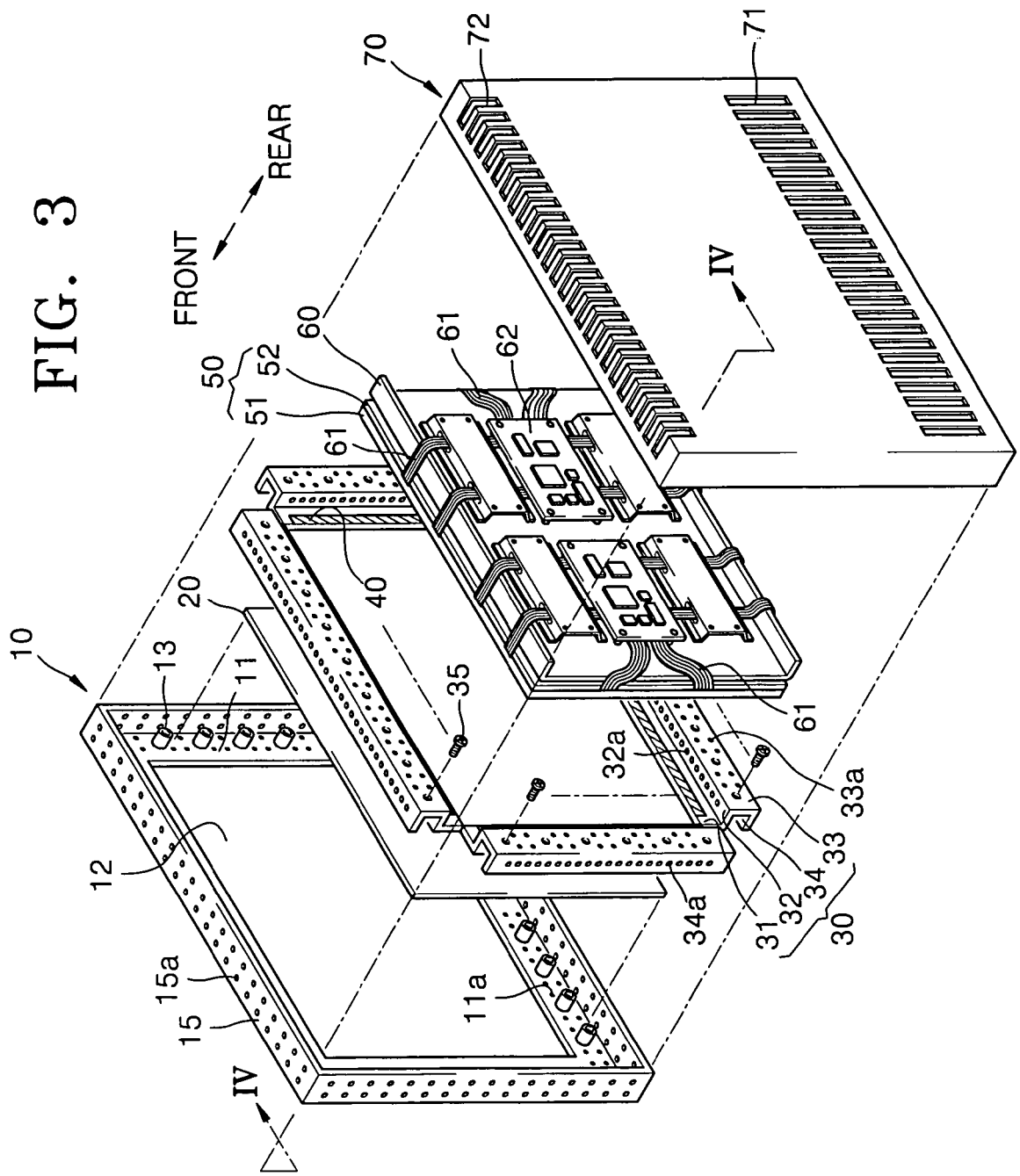
FIG. 3 is an exploded perspective view of a display apparatus according to the present invention.
Figure 4:
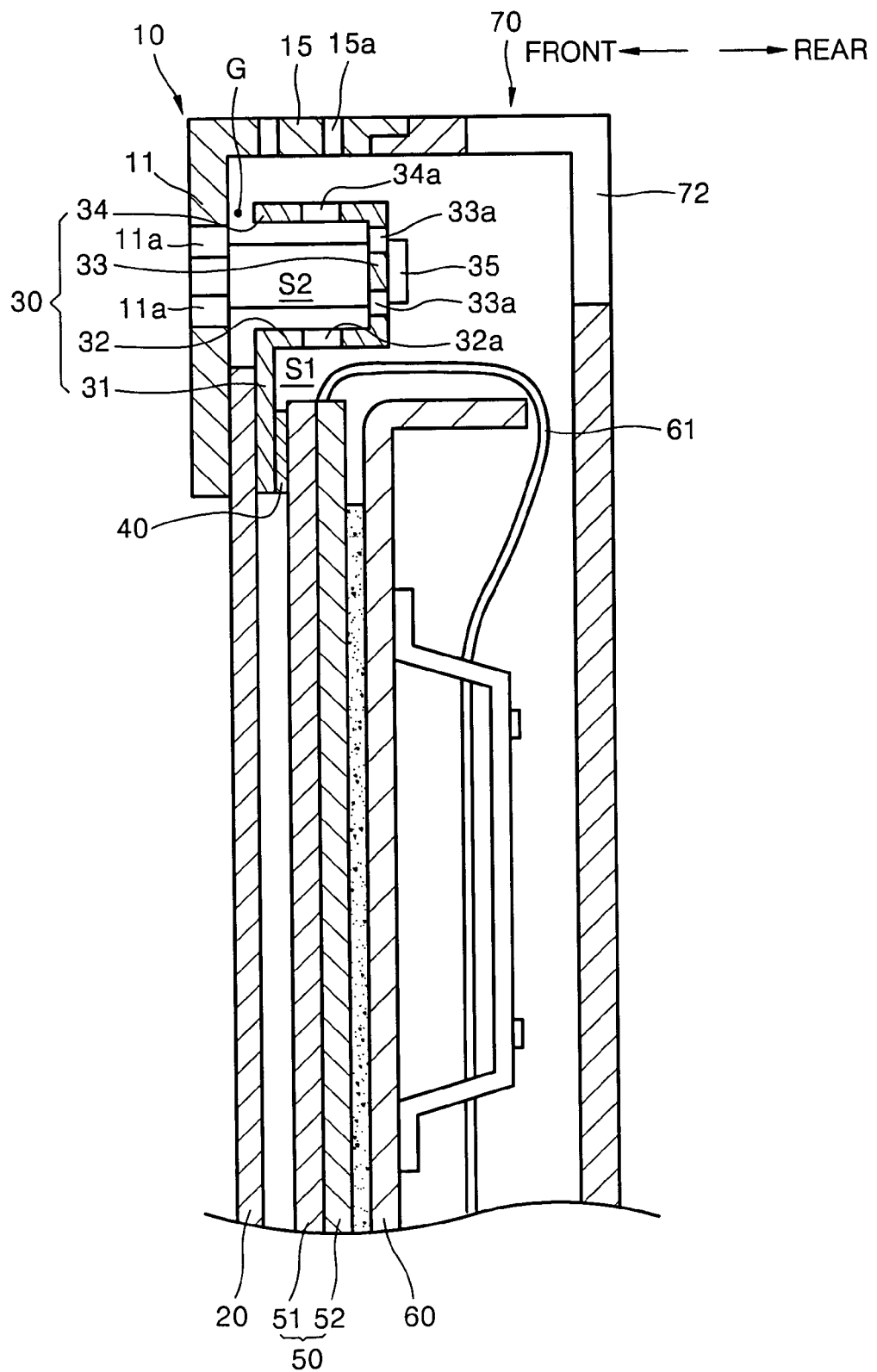
FIG. 4 is a cross-sectional view taken along line IV—IV of FIG. 3.

Referring to FIGS. 3 and 4, FIG. 3 is an exploded perspective view of a display apparatus according to the present invention, and FIG. 4 is a cross-sectional view taken along line IV'IV of FIG. 3.

The display apparatus comprises a front cabinet 10 which includes a window 12 at a center portion thereof, an EMI filter 20 disposed in a rear portion of the front cabinet 10 so as to cover the window 12, a filter holder 30 which fixes the EMI filter 20 to the front portion 11 of the front cabinet 10, a display panel 50 disposed on a rear portion of the filter holder 30, a chassis 60 which supports the display panel 50, a circuit unit 62 installed on a rear portion of the chassis 60 for driving the display panel 50, and a rear cabinet 70 disposed on a rear portion of the circuit unit 62 and coupled to the front cabinet 10.

A screw coupling portion 13, which is coupled to a fixing portion 33 of the filter holder 30 by screws 35, is formed on the front portion 11 of the front cabinet 10.

The EMI filter 20 shields an electromagnetic wave radiated from the display panel, and is grounded by a wire, a clamp, and so forth.

The filter holder 30 includes a pressing portion 31 that presses the EMI filter 20 against the front portion 11 of the front cabinet 10, a fixing portion 33 which is fixed on the front portion 11 of the front cabinet 10, and an inner wall portion 32 which connects the pressing portion 31 and the fixing portion 33. The filter holder 30 may further include an outer wall portion 34 which extends from the fixing portion 33 in a perpendicular direction for improving rigidity of the filter holder 30. First holes 32a, through which air of high temperature contained in a first space S1 can pass, is formed in the inner wall portion 32, and desirably, second holes 33a are formed in the fixing portion 33. It is desirable that fourth holes 11a be formed in the front portion 11 of the front cabinet 10. Further, when the filter holder 30 includes the outer wall portion 34, it is desirable that third holes 34a be formed in the outer wall portion 34. The holes 32a, 33a, 34a, and 11a will be described in more detail later.

Figure 5:
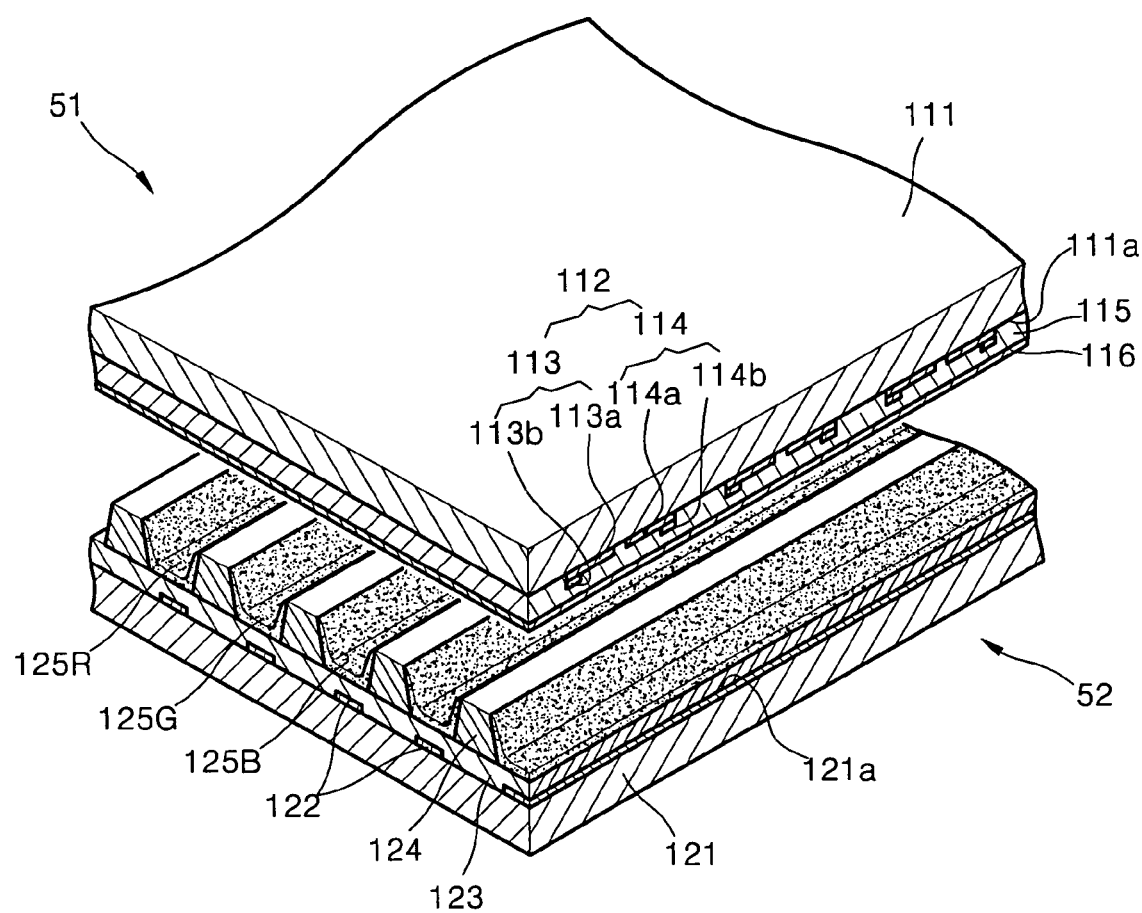
FIG. 5 is a partially exploded perspective view of a plasma display panel.

The display panel 50 may be a liquid crystal display (LCD), a plasma display panel (PDP), or a field emission display (FED). FIG. 5 illustrates a center portion of a PDP on which the image is displayed, the PDP generating a large amount of heat.

The display panel 50 includes an upper panel 51 and a lower panel 52. The upper panel 51 includes a transparent front substrate 111, pairs of sustain discharge electrodes 112, each of the pairs including a Y electrode 114 and an X electrode 113 formed on a lower surface 111a of the front substrate, and an upper dielectric layer 115 which covers the sustain discharge electrode pairs 112. It is desirable that the upper dielectric layer 115 be covered by a protective layer 116 formed of MgO. The Y electrode 114 includes a first transparent electrode 114a formed of indium-tin-oxide (ITO) and a first bus electrode 114b which prevents a voltage drop in the first transparent electrode 114a. The X electrode 113 also includes a second transparent electrode 113a and a second bus electrode 113b as in the Y electrode 114. The first and second bus electrodes 114b and 113b, respectively, may include a substance of dark color for improving the contrast of the display panel.

The lower panel 52 includes a rear substrate 121, address electrodes 122 formed on an upper surface 121a of the rear substrate 121 so as to cross the sustain discharge electrode pairs 112, a lower dielectric layer 123 which covers the address electrodes 122, a partition wall 124 formed on the lower dielectric layer 123 to define discharging cells, and phosphor layers 125R, 125G, and 125B which are applied on an inner surface of respective discharging cells. Each discharging cell is defined by two adjacent partition walls 124 and a pair of sustain discharge electrodes 112.

A peripheral portion (not shown) of the upper panel 51 and a peripheral portion (not shown) of the lower panel 52 facing the upper panel 51 are attached to each other by a seal member (not shown) formed of frit, and a space between the upper and lower panels is sealed by the seal member. The sealing operation is performed by applying frit in a liquid state between two peripheral portions, and then hardening the frit.

The operation of the display panel 50 will be described as follows. When an address discharge takes place in a discharging cell at which the address electrode 122 and the Y electrode 114 cross, the discharging cell at which sustain discharge is to take place is selected. Then, when a predetermined voltage (sustain discharge voltage) is applied between the X electrode 113 and the Y electrode 114, the sustain discharge takes place in the selected discharging cell. Discharge gas filling the discharging cell radiates ultraviolet rays due to the sustain discharge, and the ultraviolet rays excite the phosphor layers 125R, 125G, or 125B in the discharging cell. When the energy level of the excited phosphor layers 125R, 125G or 125B is lowered, the excited phosphor layers radiate a visible light. The image is realized on the display panel 50 by a plurality of discharging cells that radiate the visible light. Since sustain discharge takes place many times within a short period, the display panel 50 generates a large amount of heat.

A sponge 40 is disposed between the pressing portion 31 of the filter holder 30 and the display panel 50. The sponge 40 prevents the display panel 50 from being damaged due to direct contact or impact with the filter holder 30, enables air to flow in and out of the space between the EMI filter 20 and the display panel 50, and filters dust in the flowing air.

The chassis 60 supports the display panel 50 and the circuit unit 62, and the PDP is generally adhered to the chassis 60 by a double adhesive tape. The chassis 60 may include a wall rack portion (not shown) for hanging the display apparatus on the wall, or legs (not shown) for supporting the display apparatus on the ground.

The circuit unit 62 is connected to the display panel 50 by flexible printed circuits (FPCs). When the display panel 50 is a PDP, the circuit unit 62 is connected to the address electrodes 122 or the sustain discharge electrodes 113 and 114.

The rear cabinet 70 is disposed in the rear of the circuit unit 62, and is coupled to the front cabinet 10. An air inlet 71 is formed in a lower portion of the rear cabinet 70, and an air outlet 72 is formed above the air inlet 71. The air is induced through the air inlet 71 into an inner space defined by the front cabinet 10 and the rear cabinet 70. The air absorbs the heat radiated from the display panel 50 and the circuit unit 62, and is then discharged through the air outlet 72. The first holes 32a, the second holes 33a, the third holes 34a, and the fourth holes 11a will be described in more detail with reference to FIG. 4.

An arrangement wherein the filter holder 30 does not include the outer wall portion 34 will be described as follows. The air between the EMI filter 20 and the display panel 50 is heated by the display panel 50, and moves upward through the sponge 40 to the first space S1. Some of the heated air in the first space S1 is guided by the inner wall portion 32 of the filter holder 30, and proceeds rearward to the air outlet 72. The rest of the air passes through the first holes 32a formed in the inner wall portion 32 of the filter holder 30 to a second space S2, is guided rearward by the front cabinet 10 to the air outlet 72, and is then discharged through the air outlet 72. That is, since the number of paths for discharging the heated air increases, the air of high temperature does not stay in the first space S1, and the air between the EMI filter 20 and the display panel 50 can be discharged fluently through the air outlet. Accordingly, the heat generated by the display panel 50 can be discharged effectively. Thus, image degradation of the display panel 50 and damage to the display panel caused by the heat can be prevented.

Although the heat discharge of the display panel is improved by provision only of the first holes 32a formed in the inner wall portion 32 of the filter holder 30, second holes 33a may be formed in the fixing portion 33 of the filter holder 30, fourth holes 11a may be formed in the front portion 11 of the front cabinet 10, and/or a fifth holes 15a may be formed in a lateral portion of the front cabinet 10 so as to further improve the heat discharge. When the second holes 33a are formed in the fixing portion 33 of the filter holder 30, some of the air induced into the second space S2 can pass through the second holes 33a so as to be discharged through the air outlet 72. When the fourth holes 11a are formed in the front portion 11 of the front cabinet 10, some of the air induced into the second space S2 is discharged through the fourth holes 11a. In addition, when the fifth holes 15a are formed in the lateral portion 15 of the front cabinet 10, some of the air induced into the second space S2 is discharged outward through the fifth holes 15a.

The heat discharge of the display panel noticeably improves when the first holes 32a are formed in the inner wall portion 32 of the filter holder, the second holes 33a are formed in the fixing portion 33 of the filter holder 30, the fourth holes 11a are formed in the front portion 11 of the front cabinet 10, and the fifth holes 15a are formed in the lateral portion 15 of the front cabinet 10.

When the filter holder 30 includes the outer wall portion 34 for improving the rigidity thereof, some of the heated air in the first space S1 is guided by the inner wall portion 32 of the filter holder 30 toward the air outlet 72 as described above. However, the rest of the air passes through the first holes 32a formed in the inner wall portion 32 of the filter holder 30, the second space S2, and a gap G between the outer wall portion 34 and the front cabinet 10. The air is guided by the front cabinet 10 toward the air outlet 72, and is discharged from the cabinet through the air outlet 72. That is, since the number of paths for discharging the heated air increases, the air of high temperature does not stay in the first space S1, and the air of high temperature between the EMI filter 20 and the display panel 50 can be discharged fluently through the air outlet 72. Accordingly, the heat generated by the display panel 50 can be discharged effectively. Since the heat of the display panel is discharged effectively, image degradation of the display panel and damage to the display panel caused by the heat can be prevented.

Although the heat discharge of the display panel is improved by provision only of the first holes 32a formed in the inner wall portion 32 of the filter holder 30, second holes 33a may be formed in the fixing portion 33 of the filter holder 30, third holes 34a may be formed in the outer wall portion 34 of the filter holder 30, fourth holes 11a may be formed in the front portion 11 of the front cabinet 10, and/or fifth holes 15a may be formed in a lateral portion 15 of the front cabinet 10 so as to further improve the heat discharge. When the second holes 33a are formed on the fixing portion 33 of the filter holder 30, some of the air induced into the second space S2 can pass through the second holes 33a so as to be discharged through the air outlet 72. When the third holes 34a are formed in the outer wall portion 23 of the filter holder, some of the air induced into the second space S2 can pass through the third holes 34a so as to be discharged through the air outlet 72. When the fourth holes 11a are formed in the front portion 11 of the front cabinet 10, some of the air induced into the second space S2 is discharged through the fourth holes 11a. In addition, when the fifth holes 15a are formed in the lateral portion 15 of the front cabinet 10, some of the air induced into the second space S2 is discharged outward through the fifth holes 15a.

The heat discharge of the display panel noticeably improves when the first holes 32a are formed in the inner wall portion 32 of the filter holder, the second holes 33a are formed in the fixing portion 33 of the filter holder 30, the third holes 34a are formed in the outer wall portion 34 of the filter holder 30, the fourth holes 11a are formed in the front portion 11 of the front cabinet 10, and the fifth holes 15a are formed in the lateral portion 15 of the front cabinet 10.

According to the present invention, the heat generated by the display panel can be discharged fluently, thus preventing the image quality of the display panel from being degraded and the display panel from being damaged.

While the present invention has been particularly shown and described with reference to exemplary embodiments thereof, it will be understood by those of ordinary skill in the art that various changes in form and detail may be made therein without departing from the spirit and scope of the present invention as defined by the following claims.

What is claimed is:

1. A filter holder, comprising:
a pressing portion for pressing an EMI filter against a front portion of a front cabinet;
a fixing portion fixed on the front portion of the front cabinet; and an inner wall portion connecting the pressing portion and the fixing portion,
wherein the inner wall portion includes at least one first hole.

2. The filter holder of claim 1, further comprising an outer wall portion extending from the fixing portion in a perpendicular direction.

3. The filter holder of claim 2, wherein the outer wall portion includes at least one third hole.

4. The filter holder of claim 1, wherein the fixing portion includes at least one second hole.

5. A display apparatus, comprising:
a front cabinet including a window at a center portion of the front cabinet;
an EMI filter disposed in a rear of the front cabinet so as to cover the window;
a filter holder including a pressing portion for pressing the EMI filter against a front portion of the front cabinet, a fixing portion fixed on the front portion of the front cabinet, and an inner wall portion connecting the pressing portion and the fixing portion;
a display panel disposed in a rear of the pressing portion of the filter holder;
a chassis for supporting a display panel;
a circuit unit installed in a rear of the chassis for driving the display panel; and
a rear cabinet disposed in a rear of the circuit unit and coupled to the front cabinet;
wherein the inner wall portion of the filter holder includes at least one first hole.

6. The display apparatus of claim 5, wherein the filter holder further comprises an outer wall portion extending from the fixing portion in a perpendicular direction.

7. The display apparatus of claim 6, further comprising an outer wall portion which includes at least one third hole.

8. The display apparatus of claim 5, wherein the fixing portion includes at least one second hole.

9. The display apparatus of claim 5, wherein the front portion of the front cabinet includes at least one fourth hole.

10. The display apparatus of claim 5, wherein a lateral portion of the front cabinet includes at least one fifth hole.

11. The display apparatus of claim 5, further comprising a sponge disposed between the pressing portion of the filter holder and the display panel.

12. The display apparatus of claim 5, wherein the display panel is a plasma display panel.

13. The display apparatus of claim 12, wherein the plasma display panel comprises an upper panel and a lower panel;
the upper panel including a front substrate, pairs of sustain discharge electrodes formed under the front substrate, and an upper dielectric layer covering the sustain discharge electrodes; and
the lower panel including a rear substrate, address electrodes crossing the sustain discharge electrodes, a lower dielectric layer covering the address electrodes, at least one partition wall formed on the lower dielectric layer so as to form at least one discharge cell, and a phosphor layer applied in said discharge cell.

14. A display apparatus, comprising:
a front cabinet including a window at a center portion of the front cabinet;
an EMI filter disposed in a rear of the front cabinet so as to cover the window;
a filter holder including a pressing portion for pressing the EMI filter against a front portion of the front cabinet;
a display panel disposed in a rear of the pressing portion of the filter holder; and
discharge means for discharging heated air from a space between the filter holder and the display panel.

15. The display apparatus of claim 14, wherein the discharge means comprises at least one first hole included in an inner wall portion.

16. The display apparatus of claim 15, wherein the discharge means comprises at least one second hole included in a fixing portion of the filter holder.

17. The display apparatus of claim 16, further comprising an outer wall portion wherein the discharge means comprises at least one third hole included in the outer wall portion.

18. The display apparatus of claim 17, wherein the discharge means comprises at least one fourth hole included in the front portion of the front cabinet.

19. The display apparatus of claim 18, wherein the discharge means comprises at least one fifth hole included in a lateral portion of the front cabinet.

20. The display apparatus of claim 14, further comprising a sponge disposed between the pressing portion of the filter holder and the display panel.

* * * * *